(12) United States Patent
Choi et al.

(10) Patent No.: US 12,575,302 B2
(45) Date of Patent: Mar. 10, 2026

(54) LIGHT EMITTING DISPLAY DEVICE

(71) Applicant: LG Display Co., Ltd., Seoul (KR)

(72) Inventors: Howon Choi, Paju-si (KR); Taehyeon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 445 days.

(21) Appl. No.: 18/345,580

(22) Filed: Jun. 30, 2023

(65) Prior Publication Data

US 2024/0180004 A1 May 30, 2024

(30) Foreign Application Priority Data

Nov. 24, 2022 (KR) ........................ 10-2022-0159242

(51) Int. Cl.
| | |
|---|---|
| *H10K 59/80* | (2023.01) |
| *H10K 50/17* | (2023.01) |
| *H10K 59/121* | (2023.01) |
| *H10K 59/122* | (2023.01) |
| *H10K 59/126* | (2023.01) |

(52) U.S. Cl.
CPC ......... *H10K 59/879* (2023.02); *H10K 50/171* (2023.02); *H10K 59/1213* (2023.02); *H10K 59/122* (2023.02); *H10K 59/126* (2023.02); *H10K 59/878* (2023.02)

(58) Field of Classification Search
CPC .................................................. H10K 59/878

USPC .................................................. 313/498–512
See application file for complete search history.

(56) References Cited

U.S. PATENT DOCUMENTS

| | | | |
|---|---|---|---|
| 2007/0222379 A1* | 9/2007 | Yamazaki | H10K 50/171 |
| | | | 313/506 |
| 2015/0162390 A1* | 6/2015 | Wang | H10K 59/353 |
| | | | 257/40 |
| 2016/0248038 A1* | 8/2016 | Philippens | H10K 50/813 |
| 2019/0348624 A1* | 11/2019 | Kim | H10K 50/11 |
| 2020/0075699 A1* | 3/2020 | Kim | H10K 59/80515 |
| 2020/0136092 A1* | 4/2020 | Kim | H10K 59/876 |
| 2020/0144547 A1* | 5/2020 | Wan | H10K 59/122 |
| 2024/0224563 A1* | 7/2024 | Choi | H10K 59/122 |
| 2025/0221240 A1* | 7/2025 | Kim | H10K 59/80518 |

FOREIGN PATENT DOCUMENTS

| | | |
|---|---|---|
| KR | 10-2012-0108906 A | 10/2012 |
| KR | 10-1739771 B1 | 5/2017 |
| KR | 10-2021-0043233 A | 4/2021 |
| KR | 10-2022-0010363 A | 1/2022 |

* cited by examiner

*Primary Examiner* — Christopher M Raabe
(74) *Attorney, Agent, or Firm* — Birch, Stewart, Kolasch & Birch, LLP

(57) ABSTRACT

A light emitting display device can include a first planarization layer on a substrate, a nano-based layer having a plurality of nano particles on the first planarization layer, a first buffer layer on the nano-based layer, a reflective layer on the first buffer layer, a second planarization layer on the reflective layer, and a light emitting element on the second planarization layer.

20 Claims, 7 Drawing Sheets

LIGHT EMITTING DISPLAY DEVICE

CROSS-REFERENCE TO RELATED APPLICATIONS

This application claims priority to Korean Patent Application No. 10-2022-0159242 filed in the Republic of Korea on Nov. 24, 2022, the entire contents of which are hereby expressly incorporated by reference into the present application.

BACKGROUND

Field of the Invention

The present disclosure relates to a display device, and more particularly, for example, without limitation, to a light emitting display device.

Discussion of the Related Art

Among display devices, a light emitting display device has advantages such as a wide viewing angle, an excellent contrast ratio, and a fat response speed, and thus has attracted attention as the next-generation display. A light emitting element used in a light emitting display device generally includes an emission layer made of an organic or inorganic material between an anode electrode and a cathode electrode.

In the light emitting element, holes are supplied from the anode electrode and electrons are supplied from the cathode electrode, so that the electrons and holes are combined in the emission layer to generate excitons. As excitons are changed from an excited state to a ground state, fluorescent molecules in the emission layer emit light to reproduce color and contrast.

In this regard, power efficiency of a light emitting element is an important factor in determining power consumption needed for driving the light emitting element. As power efficiency improves, desired luminance can be obtained with a small current, which also contributes to device life extension.

There are various factors to increase the power efficiency of a light emitting element, but one of the more relevant factors is to increase the coupling efficiency of holes and electrons for light extraction.

In a structure of a light emitting display device actually implemented, an optical waveguide can be formed between a transparent conductive layer used for an anode electrode or a cathode electrode having a relatively high refractive index and an emission layer. Therefore, about 50% e.g. of the light generated in the emission layer can be trapped inside the optical waveguide, and about 30% e.g. of the light can be trapped inside the display device due to total reflection caused by the difference in refractive index between the glass substrate and the air layer of environment. As a result, the amount of light finally emitted toward the user can be reduced down to about 20% e.g.

In order to overcome this issue, a method of improving light extraction efficiency of a light emitting element by inserting a micro-lens or nano-sized structure into the device has been developed. In particular, there is a growing need to develop a light emitting display device with improved light extraction efficiency with a nano-structure.

SUMMARY OF THE DISCLOSURE

Therefore, the inventors of the present disclosure recognized the issues mentioned above and other limitations associated with the related art, and conducted various experiments to implement a light emitting display device in which light extraction efficiency may be improved with a nano-structure.

One purpose of the present disclosure, in order to solve or address the above-identified issues and other limitations associated with the related art, is to provide a light emitting display device having improved light extraction efficiency with a nano-structure.

Another purpose of the present disclosure is to provide a light emitting display device having a nanostructure and maximizing light efficiency by flattening the upper surface of the emission layer.

In one embodiment of the present disclosure, a light emitting display device comprises a first planarization layer on a substrate; a nano-based layer having a plurality of nano particles on the first planarization layer; a first buffer layer on the nano-based layer; a reflective layer on the first buffer layer; a second planarization layer on the reflective layer; and a light emitting element formed on the second planarization layer.

In one embodiment of the present disclosure, the plurality of nano particles has a protrusion shape disposed on a top surface of the nano-based layer.

In one embodiment of the present disclosure, the first buffer layer includes a plurality of protrusions corresponding to the plurality of nano particles. The reflective layer includes a plurality of reflective protrusions corresponding to the plurality of protrusions.

In one embodiment of the present disclosure, the second planarization layer provides a flat top surface on the plurality of reflective protrusions. The light emitting element contacts the flat top surface of the second planarization layer.

In one embodiment of the present disclosure, the light emitting display device further comprises a driving layer including thin film transistors disposed between the substrate and the first planarization layer, wherein the first planarization layer has a thickness in range of 2 μm to 3 μm.

In one embodiment of the present disclosure, the second planarization layer has a thickness in range of 20 nm to 500 nm and a refractive index in range of 1.8 to 2.0.

In one embodiment of the present disclosure, the light emitting display device further comprises a second buffer layer between the first planarization layer and the nano-based layer.

In one embodiment of the present disclosure, the light emitting element includes an anode electrode on the second planarization layer; an emission layer on the anode electrode; and a cathode electrode on the emission layer.

In one embodiment of the present disclosure, each of the anode electrode, the emission layer and the cathode electrode provides a flat top surface at the area where the plurality of nano particles is disposed.

In one embodiment of the present disclosure, the nano-based layer and the reflective layer have a shape and a size corresponding to the anode electrode.

In one embodiment of the present disclosure, the light emitting display device further comprises: a bank covering circumference areas of the anode electrode to define an emission area.

In one embodiment of the present disclosure, the bank includes a black resin material.

In one embodiment of the present disclosure, the nano-based layer includes indium-tin-oxide.

In one embodiment of the present disclosure, the reflective layer includes at least one of silver (Ag), aluminum (Al), molybdenum (Mo), gold (Au), magnesium (Mg), calcium (Ca), and barium (Ba).

Further, a light emitting display device according to the present disclosure comprises a planarization layer on a substrate; a nano-based layer including a plurality of nano particles disposed on the planarization layer; a first buffer layer on the nano-based layer, an anode electrode including a reflective material on the first buffer layer; an emission layer on the anode electrode; an inorganic layer on the emission layer; an organic layer on the inorganic layer, and a cathode electrode on the organic layer.

In one embodiment of the present disclosure, the inorganic layer includes an electron injection material. The organic layer includes an electron transport material.

In one embodiment of the present disclosure, the plurality of nano patterns includes a plurality of first protrusions disposed on a top surface of the nano-based layer. The first buffer layer includes a plurality of second protrusions corresponding to the plurality of first protrusions. The anode electrode includes a plurality of reflective protrusions corresponding to the plurality of second protrusions. The emission layer and the inorganic layer have a cross-sectional profile corresponding to the plurality of reflective protrusions.

In one embodiment of the present disclosure, the organic layer provides a flat top surface on the inorganic layer. The cathode electrode has a flat surface on the flat top surface of the organic layer.

Further, a light emitting display device according to the present disclosure comprises a nano-based layer including a plurality of nano particles on a substrate; a reflective layer including a plurality of protrusions corresponding to the plurality of nano particles on the plurality of nano patterns; an anode electrode on the reflective layer; an emission layer on the anode electrode; and a cathode electrode on the emission layer. The anode electrode has a cross-sectional profile that is same as or different from the reflective layer. The cathode electrode has a cross-sectional profile that is different from the reflective layer.

In addition, a light emitting display device according to the present disclosure comprises a nano-based layer including a plurality of nano particles on a substrate; a reflective layer including a plurality of protrusions corresponding to the plurality of nano particles; an anode electrode on the reflective layer; an emission layer on the anode electrode; a cathode electrode on the emission layer; and a planarization layer between the reflective layer and anode electrode, or between the emission layer and the cathode electrode.

The light emitting display device according to various embodiments of the present disclosure can provide a light emitting display device with improved extraction efficiency of light generated from the emission layer by forming the nano-structure under the anode electrode. In addition, the present disclosure can provide a light emitting display device that can be driven with low power consumption by maximizing light efficiency by flattening the light emitting surface of the light emitting element in forming a light emitting element having a nano-structure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
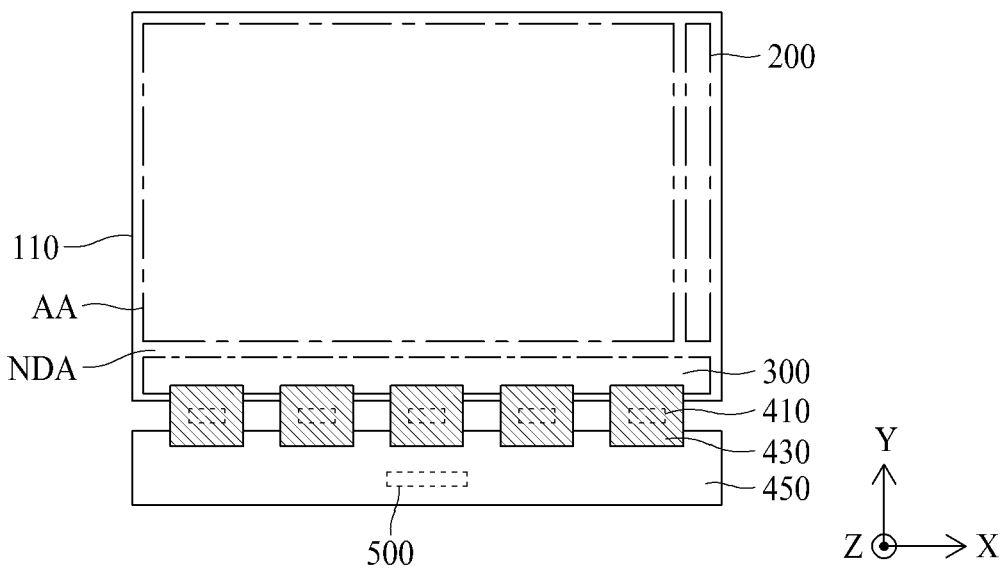
FIG. 1 is a plane view illustrating a schematic structure of a light emitting display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration can unnecessarily obscure an important point of the present disclosure, a detailed description of such known function of configuration can be omitted or briefly provided.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted or briefly provided. The terms described in the specification should be understood as follows.

In the present specification, where the terms "comprise", "have", "include", "contain", "consist of", "constitute", "make up of", "formed of" and the like are used, one or more other elements can be added unless a more limiting term, such as "only", "merely" etc. is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on", "over", "under", "above", "below", "beneath", "beside", "next to", "adjacent to", "close to" or the like, one or more other parts can be located between the two parts unless a more limiting term, such as "immediate(ly)", "direct(ly)", or "close(ly)" is used. For example, where an element or layer is disposed "on" another element or layer, a third layer or element can be interposed therebetween. Further, if a first element is described as positioned "on" a second element, it does not necessarily mean that the first element is positioned above the second element in the figure. The upper part and the lower part of an object concerned can be changed depending on the orientation of the object. Consequently, where a first element is described as positioned "on" a second element, the first element can be positioned "below" the second element or "above" the second element in the figure or in an actual configuration, depending on the orientation of the object.

In describing a temporal relationship, when the temporal order is described as, for example, "after", "subsequent", "next", or "before", a case which is not continuous can be included unless a more limiting term, such as "just", "immediate(ly)", or "direct(ly)" is used.

It will be understood that, although the terms "first", "second" "A", "B", "(a)", "(b)" and the like can be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

Where an element is described as being "adhered", "linked", "coupled," or "connected" to another element, that element can be directly or indirectly connected to that other element unless otherwise specified. It is to be understood that additional element or elements can be "interposed" or "disposed" between the two elements that are described as "linked," "connected", or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings can be different from an actual scale for convenience of description, the present disclosure is not limited to the scale shown in the drawings.

Hereinafter, referring to the attached figures, a light emitting display device according to the present disclosure will be explained. In adding reference numerals to elements of each drawing, the same elements can have the same numerals as much as possible even if they are displayed on different drawings. Further, all the components of each light emitting display device according to all embodiments of the present disclosure are operatively coupled and configured. The following embodiments can be partially or entirely bonded to or combined with each other and can be linked and operated in technically various ways. The embodiments can be carried out independently of or in association with each other.

FIG. 1 is a plane view illustrating a schematic structure of an electroluminescence display according to an embodiment of the present disclosure. In FIG. 1, X-axis refers to the direction parallel to a scan line, Y-axis refers to the direction of a data line, and Z-axis refers to the height (or thickness) direction of the display.

Referring to FIG. 1, a light emitting display device comprises a substrate 110, a gate (or scan) driver 200, a data pad portion 300, a source driving IC (Integrated Circuit) 410, a flexible film 430, a circuit board 450, and a timing controller 500. More or less elements than shown may be included in the light emitting display device.

The substrate 110 can include an electrical insulating material or a flexible material. The substrate 110 can be made of a glass, a metal or a plastic, but it is not limited thereto. When the light emitting display device is a flexible display, the substrate 110 can be made of the flexible material such as plastic. For example, the substrate 110 can include any one of polyimide, polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC), polyvinyl alcohol (PVA), and polystyrene (PS), which is only an example and is not necessarily limited thereto.

The substrate 110 can include a display area (or active area) AA and a non-display area NDA (e.g. bezel area). The display area AA, which is an area for representing or displaying images such as video images, can be defined as the majority middle area of the substrate 110, but it is not limited thereto, and may be defined as any area of the substrate 110. In the display area AA, at least a plurality of scan lines (or gate lines), a plurality of data lines and a plurality of pixels which are located in cross portions of the plurality of scan lines (or gate lines) and the plurality of data lines can be formed or disposed. Each of the pixels can include a plurality of sub pixels. Each of the sub pixels can include or utilize the scan line and the data line, respectively, as well as other lines such as power line, touch sensing line, etc. Hereinafter, "pixel" and "sub pixel" may be used interchangeably.

The non-display area NDA, which is an area not representing or displaying the video images, can be defined at the circumference areas of the substrate 110 surrounding all or some of the display area AA. For example, the non-display area NDA may be positioned to the left side and/or right side of the display area AA, and/or to the upper side and/or lower side of the display area AA. In the non-display area NDA, the gate driver 200 and the pad portion 300 as well as other elements or wirings can be formed or disposed.

The gate driver 200 can sequentially supply the scan (or gate) signals to the scan lines according to the gate control signal received from the timing controller 500 via the pad portion 300. The gate driver 200 may shift the gate signal by using a shift register to sequentially supply the scan signals to the scan lines. The gate driver 200 can be formed at the non-display area NDA at any one outside of the display area AA on the substrate 110, as a GIP (Gate driver In Panel) type. GIP type means that the gate driver 200 is directly formed on the substrate 110. For example, the gate driver 200 can include a shift register. The GIP type refers to a structure in which transistors configuring the shift register of the gate driver 200 are directly formed on the substrate 110. Embodiments are not limited thereto. As an example, the gate driving circuit 120 may be formed as a tape automated bonding (TAB) type, or a chip on glass (COG) type or a chip on panel (COP) type, or a chip on film (COF) type.

The pad portion 300 can be disposed in the non-display area NDA at one edge of the display area AA of the substrate 110. The pad portion 300 can include data pads connected to each of the data lines through a plurality of line lines, driving current pads connected to the driving current lines through gate control signal lines, a high potential pad receiving a high potential voltage and a low potential pad receiving a low potential voltage, among other pads.

The source driving IC 410 can be connected to the data lines and can receive the digital video data and the source control signal from the timing controller 500. The source driving IC 410 can convert the digital video data into the analog data voltages according to the source control signal and then supply that to the data lines. The source driving IC 410 may be mounted on the flexible circuit film 430 and bonded to the display panel and a source printed circuit board (PCB) SPCB through an anisotropic conductive film (ACF). When the source driving IC 410 is made as a chip type, it can be installed on the flexible circuit film 430 as a COF (Chip On Film) or COP (Chip On Plastic) type. Alternatively, the source driving IC 410 may be connected to a bonding pad of the display panel by a tape automated bonding (TAB) method or a chip-on-glass (COG) method. Alternatively, the source driving IC 410 may be disposed directly on the display panel. Alternatively, the source driving IC 410 may be integrated and disposed on the display panel in some cases.

The flexible circuit film 430 can include a plurality of first link lines connecting the pad portion 300 to the source driving IC 410, and a plurality of second link lines connecting the pad portion 300 to the circuit board 450. The flexible circuit film 430 can be attached on the pad portion 300 using an anisotropic conducting film, so that the pad portion 300 can be connected to the first link lines of the flexible film 430. The flexible circuit film 430 may be attached at the pad portion 300 provided at a first edge of the substrate 211 of the display panel using a film attachment process. The flexible circuit film 430 may be bent to surround a side surface of the display panel.

The circuit board 450 can be attached to the flexible circuit film 430. The circuit board 450 can include a plurality of circuits implemented as the driving chips. For example, the circuit board 450 can be a printed circuit board including a flexible printed circuit board in which case the circuit board 450 may be applied as a film on plastic (FOP) directly mounted on or attached to the display panel.

The timing controller 500 can receive the digital video data and the timing signal from an external system through the line cables of the circuit board 450. The timing controller 500 may modulate digital data based on the sensing result of the pixel to compensate for a driving characteristic change of the pixel. The timing controller 500 can generate a gate control signal for controlling the operation timing of the gate driver 200 and a source control signal for controlling the source driving IC 410, based on the timing signal. The timing signal may include a vertical synchronization signal Vsync, a horizontal synchronization signal Hsync, a clock CLK, a data enable signal DE, and the like. The timing controller 500 can supply the gate control signal to the gate driver 200 and supply the source control signal to the source driving IC 410. Depending on the product types, the timing controller 500 can be formed as one chip with the source driving IC 410 and mounted on the substrate 110 to be connected to pad portion 300.

First Embodiment

Figure 2:
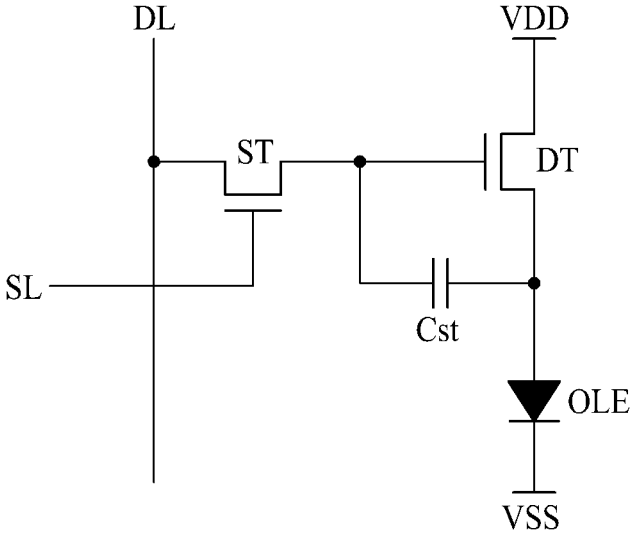
FIG. 2 is a circuit diagram illustrating a structure of one pixel included in the light emitting display device according to an embodiment of the present disclosure.
Figure 3:
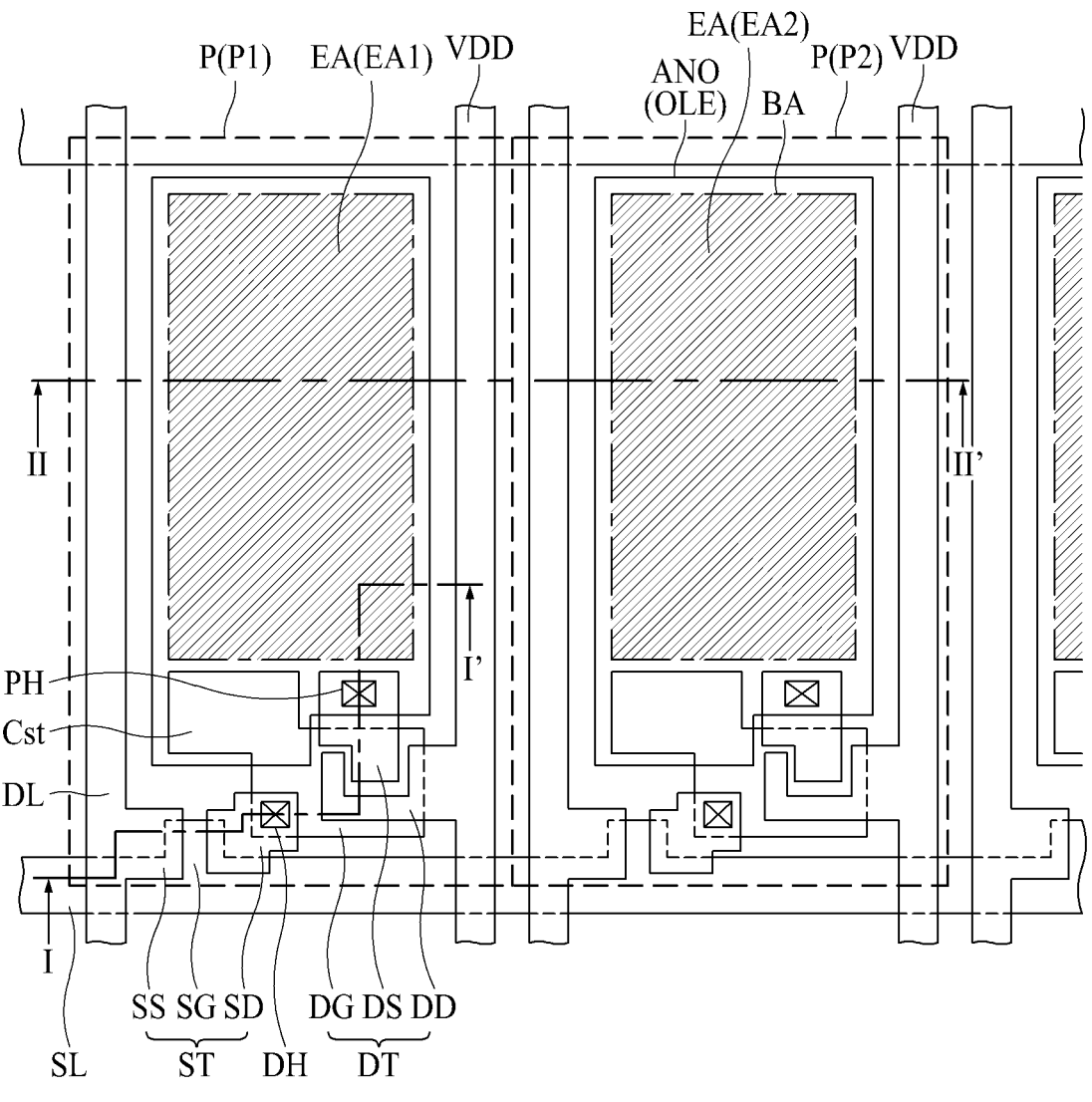
FIG. 3 is a plan view illustrating a structure of the pixels disposed in the light emitting display device according to an embodiment of the present disclosure.
Figure 4:
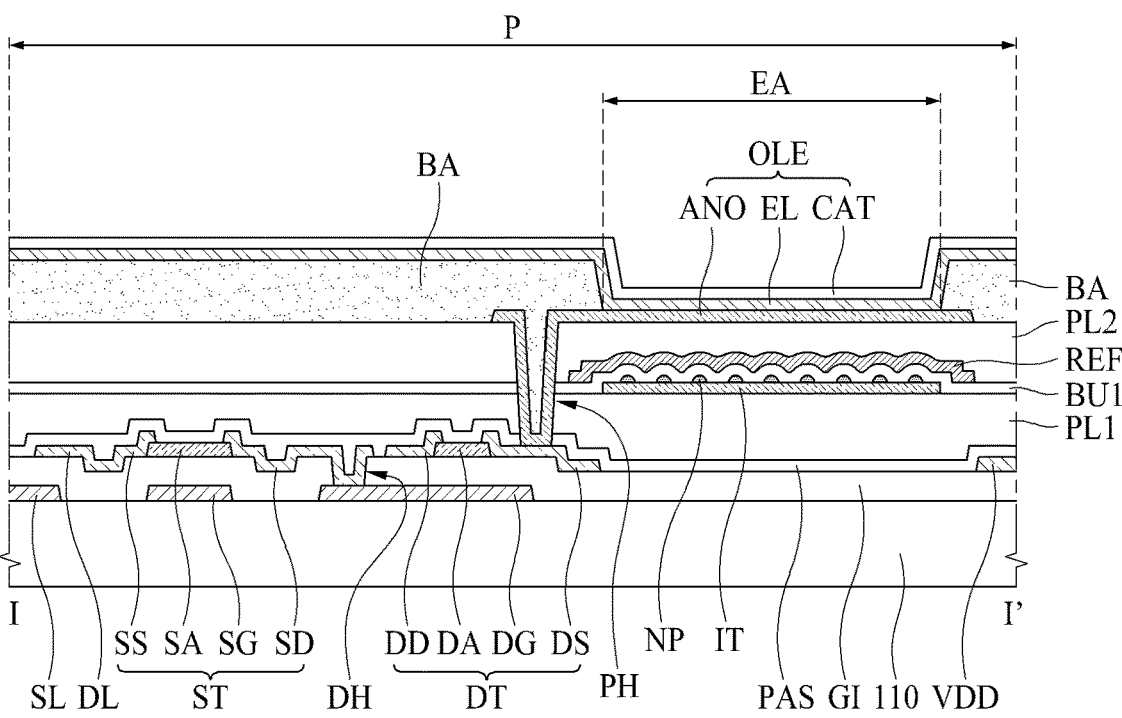
FIG. 4 is a cross-sectional view along to cutting line I-I' in FIG. 3, for illustrating a structure of the light emitting display device according to a first embodiment of the present disclosure.
Figure 5:
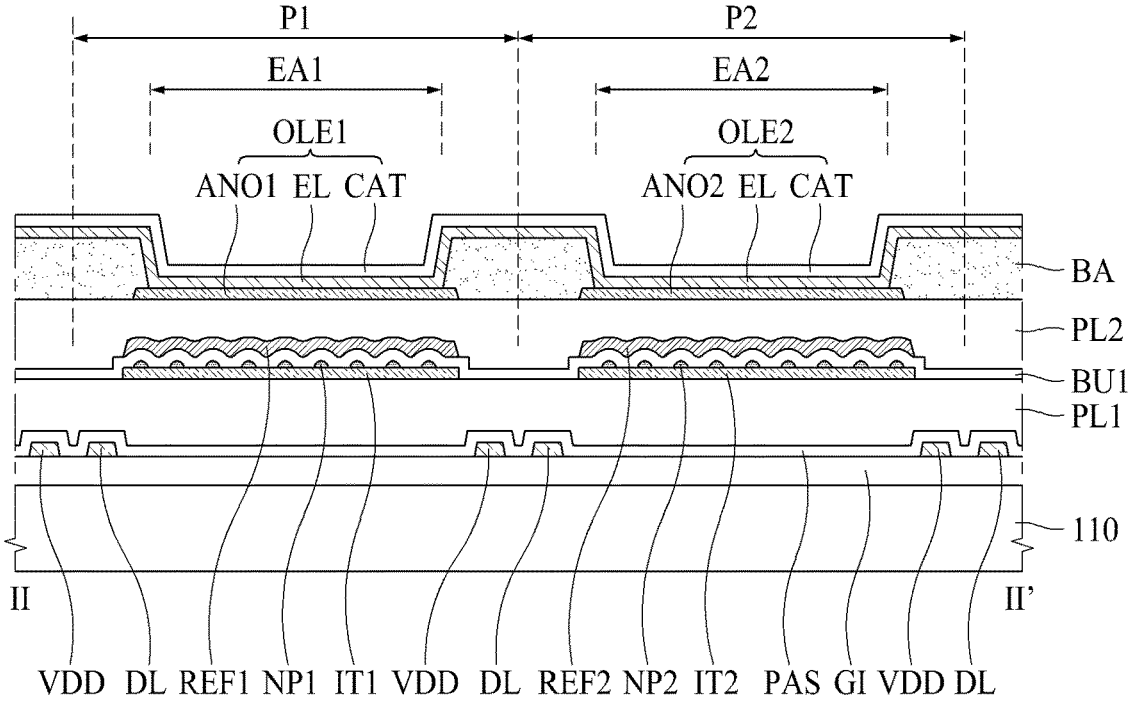
FIG. 5 is a cross-sectional view along to cutting line II-II' in FIG. 3, for illustrating a structure of the light emitting display device according to the first embodiment of the present disclosure.

Hereinafter, referring to FIGS. 2 to 5, a first embodiment of the present disclosure will be explained. FIG. 2 is a circuit diagram illustrating a structure of one pixel included in the light emitting display device according to the present disclosure. FIG. 3 is a plan view illustrating a structure of the pixels disposed in the light emitting display device according to the present disclosure. FIG. 4 is a cross-sectional view along to cutting line I-I' in FIG. 3, for illustrating a structure of the light emitting display device according to the first embodiment of the present disclosure. FIG. 5 is a cross-sectional view along to cutting line II-II' in FIG. 3, for illustrating a structure of the light emitting display device according to the first embodiment of the present disclosure.

Referring to FIGS. 2 to 5, the light emitting display device comprises a plurality of pixels P disposed in a matrix manner. Each pixel P of the light emitting display device can be defined by a scan line SL, a data line DL and a driving current line VDD. Each pixel of the light emitting display device can include a switching thin film transistor ST, a driving thin film transistor DT, a light emitting diode OLE (such as an organic light emitting diode or inorganic light emitting diode) and a storage capacitance Cst, which may be called a 2T1C structure since two transistors and one capacitor are disposed. Embodiments of the present disclosure are not limited to this. For example, 3T1C, 4T1C, 4T2C, 5T2C, 6T2C, 7T1C, 7T2C, 8T2C structures and etc. are also possible, and more or less transistors and capacitors could be included. The driving current line VDD can be supplied with a high-level voltage for driving the light emitting diode OLE.

As shown in FIG. 2, a switching thin film transistor ST and a driving thin film transistor DT can be formed on a substrate SUB. For example, the switching thin film transistor ST can be configured to be connected to the scan line SL and the data line DL. The switching thin film transistor ST can include a gate electrode SG, a source electrode SS and a drain electrode SD. The gate electrode SG of the switching thin film transistor ST can be connected to the scan line SL or branched from the scan line SL. The source electrode SS of the switching thin film transistor ST can be connected to the data line DL or branched from the data line DL, and the drain electrode SD can be connected to a gate electrode of the driving thin film transistor DT. By supplying the data signal to the driving thin film transistor DT under control of the scan line SL, the switching thin film transistor ST can play a role of selecting a pixel which would be driven.

The driving thin film transistor DT can play a role of driving the light diode OLE of the selected pixel by the switching thin film transistor ST. The driving thin film transistor DT can include a gate electrode DG, a source electrode DS and a drain electrode DD. The gate electrode DG of the driving thin film transistor DT can be connected to the drain electrode SD of the switching thin film transistor ST. For example, the gate electrode DG of the driving thin film transistor DT can be connected to the drain electrode SD of the switching thin film transistor ST via the drain contact hole DH penetrating the gate insulating layer GI, as shown in FIG. 4. For the driving thin film transistor DT, the drain electrode DD can be connected to the driving current line VDD or branched from the driving current line VDD, and the source electrode DS can be connected to an anode electrode ANO of the light emitting diode (or light emitting element) OLE via a pixel contact hole PH penetrating a first planarization layer PL1, a first buffer layer BU1, a second planarization layer PL2 and the passivation layer PAS as shown in FIG. 4. A storage capacitance Cst can be disposed between the gate electrode DG of the driving thin film transistor DT and the anode electrode ANO of the light emitting diode OLE.

The light emitting diode OLE can include an anode electrode ANO, an emission layer EL and a cathode electrode CAT. The anode electrode ANO can be disposed in the pixel P. The emission layer EL and the cathode electrode CAT are sequentially stacked on the anode electrode ANO that is, the emission layer EL is formed between the anode electrode ANO and the cathode electrode CAT. A portion of the anode electrode ANO that generates lights by contacting the emission layer EL can be defined as the emission area EA. For example, the emission area EA can be defined by a bank BA covering an edge portion of the anode electrode ANO and exposing most of the central area. In this case, visible light is emitted from the emission area EA.

The light emitting diode OLE can emit the light for representing video images according to the amount of the electric current controlled by the driving thin film transistor DT. The driving thin film transistor DT can be disposed between the driving current line VDD and the light emitting diode OLE. The driving thin film transistor DT can control the amount of the electrical current flowing from the driving current line VDD to the light emitting diode OLE according to the voltage difference between the gate electrode DG and the source electrode DS of the driving thin film transistor DT. The anode electrode ANO of the light emitting diode OLE can be connected to the source electrode DS of the driving thin film transistor DT via a pixel contact hole PH penetrating a first planarization layer PL1, a first buffer layer BU1, a second planarization layer PL2 and the passivation layer PAS as shown in FIG. 4, and the cathode electrode CAT of the light emitting diode OLE can be connected to the low voltage line VSS to which the low-potential voltage is supplied. Accordingly, the light emitting diode OLE can be driven by the current flowing from the driving current line VDD to the low-power line VSS by the driving thin film transistor DT.

Referring to cross-sectional view of FIG. 4, the thin film transistors ST and DT are formed on the substrate 110. The thin film transistors ST and DT have a structure in which gate electrodes SG and DG, gate insulating layer GI, semiconductor layers SA and DA, and source-drain electrodes SS-SD and DS-DD are stacked. These stacked structures can be referred to as a driving layer. In present disclosure, the thin film transistors ST and DT are formed as bottom gate type, however, the embodiments are not limited thereto, the thin film transistors ST and DT are formed as top gate type.

On the substrate 110 having the thin film transistors ST and DT, a passivation layer PAS can be deposited. The passivation layer PAS preferably is made of an inorganic material such as silicon oxide (SiOx), silicon nitride (SiNx) or silicon oxynitride (SiONx). A first planarization layer PL can be deposited on the passivation layer PAS. The first planarization layer may have a thickness in range of 2 μm to 3 μm, for example 2.5 μm. The first planarization layer PL1 can be a thin film for flattening or evening the non-uniform surface of the substrate 110 on which the thin film transistors ST and DT are formed. To do so, the first planarization layer PL1 can be made of the organic materials. For example, the first planarization layer PL1 may be formed of an acrylic resin, an epoxy resin, a phenolic resin, photo acryl, benzocyclobutene (BCB), polyimide (PI), or polyamide (PA), but is not limited thereto.

On the surface of the first planarization layer PL, a nano base layer IT is disposed. A plurality of nano-particles (or, nano-patterns) NP are formed on the upper surface of the nano-based layer IT. The nano-based layer IT can be formed of a transparent conductive material such as indium tin oxide (ITO), indium-zinc-oxide (IZO), indium tin zinc oxide (ITZO), or the like. The nano-particles NP can be formed of an indium material precipitated from an indium tin oxide material. The nano-particles NP can be scattered on the surface of the nano-based layer IT in an irregular arrangement.

On the nano base layer IT, a first buffer layer BU1 is deposited as covering the whole of the substrate 110. The first buffer layer BU1 can include a nitride, oxide or oxynitride material. For example, the first buffer layer BU1 can be formed of a single layer of silicon nitride(SiNx), silicon oxide (SiOx), or silicon oxynitride (SiONx). As another example, the first buffer layer BU1 can be formed as a multilayer film. For example, the first buffer layer BU1 can have a structure in which a thin layer made of silicon nitride (SiNx), silicon oxide (SiOx), and/or silicon oxynitride (SiONx) and a thin layer made of silicon oxide (SiOx), silicon nitride (SiNx), and/or silicon oxynitride (SiONx) are stacked.

In the process of depositing the first buffer layer BU1, hydrogen particles can combine with oxygen of indium tin oxide, indium-zinc-oxide or indium tin zinc oxide included in the nano-based layer IT, and indium material is precipitated to form nano-particles NP. The first buffer layer BU1 is applied over the entire substrate 110 to cover the nano-based layer IT on which the nano-particles NP are formed. Since the first buffer layer BU1 is an inorganic material, the protruding shape of the nano-particle NP can be reflected on the surface as it is, so that the first buffer layer BU1 is not flat and has an upper surface in which concave-convex portions are reflected.

A reflective layer REF can be stacked on the first buffer layer BU1. The reflective layer REF can be formed of a metal material having excellent light reflectivity. For example, the reflective layer REF can be made of any one material or an alloy of two or more materials selected from silver (Ag), aluminum (Al), molybdenum (Mo), gold (Au), magnesium (Mg), calcium (Ca), barium (Ba) or other reflective material.

The nano-based layer IT and the reflective layer REF can have shapes corresponding to the emission area EA disposed in each pixel P, except where the pixel contact hole PH can be formed. Furthermore, the first buffer layer BU1 interposed between the nano-based layer IT and the reflective layer REF can be applied over the entire display area AA to cover all of the pixels P disposed on the substrate 110.

For example, the nano-based layer IT and the reflective layer REF have the same shape as the emission area EA and can be patterned in an island shape having a slightly larger size. For example, the emission area EA can be formed in a quadrangular, rhombic, diamond, tetragonal, parallelogram, pentagonal, hexagonal, octagonal, circular, oval, elliptical shape or the like. In addition, the nano-based layer IT and the reflective layer REF can also have a quadrangular, rhombic, diamond, tetragonal, parallelogram, pentagonal, hexagonal, octagonal, circular, oval, elliptical shape or the like. Shapes of the emission area EA, the nano-based layer IT and the reflective layer REF are not limited to above listed shapes, as long as the shape of emission area EA is corresponding to those of the nano-based layer IT and the reflective layer REF. In addition, the nano-based layer IT and the reflective layer REF can be overlapped so that the entire area of the anode electrode ANO can be positioned inside the area.

Since a plurality of concave and convex portions are disposed in the reflective layer REF, when light is emitted from the emission layer EL and the reflected in the reflective layer REF, the light luminance distribution can be evenly diffused while the reflection direction is diffused in wider angle. Since the surface of the reflective layer REF is not flat, when the light emitting diode OLE can be formed thereon, the top surface of the light emitting diode OLE is also not flat. For example, the emission layer EL of the light emitting diode can have a cross-sectional shape in which concave portions and convex portions are continuously disposed, and light loss may occur due to such curvature. When concave and convex portions are reproduced on the upper surface of the emission layer EL, light emission efficiency of light from the emission layer EL may be reduced.

In order to compensate for the non-uniformity of the surface of the reflective layer REF, a second planarization layer PL2 can be stacked on the reflective layer REF. In order to uniformity compensate for the height differences, the second planarization layer PL2 can be made of an organic material such as an acrylic resin, an epoxy resin, a phenolic resin, photo acryl, benzocyclobutene (BCB), polyimide (PI), or polyamide (PA), but is not limited thereto. The protrusion height of the nano-particles NP formed on the nano-based layer IT can be 5 nm to 200 nm (e.g., 100 nm). Therefore, even when the second planarization layer PL2 can have a thickness of 20 nm to 500 nm (e.g., 260 nm), the height difference of the reflective layer REF can be uniformly compensated. The protrusion height of the nano-particles NP and the thickness of the second planarization layer PL2 are not limited to above values, and may be any values as long as the height difference of the reflective layer REF may be uniformly compensated.

The anode electrode ANO is formed on the upper surface of the second planarization layer PL2. Since the upper surface of the second planarization layer PL2 has a flat surface, the anode electrode ANO has a flat surface. The anode electrode ANO is connected to the source electrode DS of the driving thin film transistor DT through the pixel contact hole PH penetrating a first planarization layer PL1, a first buffer layer BU1, a second planarization layer PL2 and the passivation layer PAS as shown in FIG. 4. The anode electrode ANO can include an oxide conductive material such as indium zinc oxide (IZO) or indium tin oxide (ITO), tin oxide (TO), indium tin zinc oxide (ITZO), or the like.

The second planarization layer PL2 can directly contact the anode electrode ANO. Light generated from the emission layer EL can pass through the anode electrode ANO and can be reflected again by the reflective layer REF. For example, the second planarization layer PL2 can be positioned on an optical path of light generated from the emission layer EL. Accordingly, light loss can be minimized when the second planarization layer PL2 can have a refractive index similar to that of the anode electrode ANO. For example, when the anode electrode ANO can be made of indium tin oxide, the second planarization layer PL2 preferably can have a refractive index of 1.8 to 2.0 similar to that of the anode electrode ANO.

While the anode electrode ANO is formed on the reflective layer REF, it should be connected to the driving thin film transistor DT disposed under the nano-based layer IT. Accordingly, a pixel contact hole PH is formed as exposing a portion of source electrode DS of the driving thin film transistor DT by penetrating through the passivation layer PAS, the first planarization layer PL1, the first buffer layer BU1 and the second planarization layer PL2. In order to prevent the anode electrode ANO from contacting the reflective layer REF and the nano-based layer IT, it is preferable not to form the nano-based layer IT and the reflective layer REF in the portion where the pixel contact hole PH is to be formed.

A bank BA can be formed over the anode electrode ANO. For example, the bank BA can cover the edge area of the anode electrode ANO and exposes most of the central area to define the emission area EA. To ensure uniform luminous efficiency in the emission area EA, the bank BA can be formed to cover the pixel contact hole PH.

The emission layer EL can be stacked on the anode electrode ANO and the bank BA. Since the surface of the anode electrode ANO is flat, the emission layer EL also has a flat surface. The emission layer EL can be formed over the entire display area AA of the substrate 110 to cover the anode electrode ANO and the bank BA. In the case of an organic light emitting display device, the emission layer EL can include an organic material (for example, (poly)fluorene derivatives(PF), (poly)paraphenylenevinylene derivatives (PPV), polyphenylene derivatives(PP), polyparaphenylene derivatives (PPP), polyvinylcarbazole (PVK), polythiophene derivatives, and polymethylphenylsilane (PMPS)). For example, the organic material may include, but not limited to, a hole injection layer (HIL), a hole transport layer (HTL), a light emission layer (EML), an electron transport layer (ETL), and an electron injection layer (EIL). When a voltage is applied to the anode and cathode electrodes of the light emitting diode LED, holes passing through the hole transport layer (HTL) and electrons passing through the electron transport layer (ETL) move to the emission layer (EL) to form excitons. In the case of an inorganic light emitting display device, the emission layer EL can be made of an inorganic material (for example, a nano-sized material, a quantum dot, or the like). In addition, the light emitting element EL may be implemented as a tandem structure with a plurality of light emitting layers stacked on top of each other. The light emitting element EL having the tandem structure may improve the luminance and lifespan of pixels.

The emission layer EL according to an example can include two or more vertically stacked light emitting portions to emit white light. For example, the emission layer EL can include a first light emitting portion emitting a first light and a second light emitting portion emitting a second light for generating white light by mixing the first light and the second light.

As another example, the emission layer EL can include any one of a blue light emitting portion, a green light emitting portion and a red light emitting portion for emitting light corresponding to a color set in a pixel, but is not limited thereto. The emission layer EL may include any one of a light emitting portion of other colors such as purple red (Magenta), cyan (Cyan), and yellowish green (or yellow). In addition, the light emitting diode OLE can further include a functional layer for improving light emitting efficiency and/or lifetime of the emission layer EL.

The cathode electrode CAT can be stacked to make surface contact with the emission layer EL. Since the surface of the emission layer EL is flat, the cathode electrode CAT also has a flat surface. The cathode electrode CAT is formed over the entire substrate 110 to be commonly connected to the emission layer EL formed in all pixels. Since the present disclosure relates to a top emission type display device, the cathode electrode CAT can include a transparent conductive material. For example, the cathode electrode CAT can include indium tin oxide (ITO), indium zinc oxide (IZO), tin oxide (TO), indium tin zinc oxide (ITZO), or the like. Although the anode electrode ANO can also be formed of a transparent conductive material, since the reflective layer REF is disposed below the anode electrode ANO, light generated from the emission layer EL can be emitted through the cathode electrode CAT.

The light emitting diode OLE can be formed in the emission area where the anode electrode ANO, the emission layer EL and the cathode electrode CAT are stacked. An encapsulation layer can be further stacked on the light emitting diode OLE. The encapsulation layer can have a structure in which a first inorganic encapsulation layer, an organic encapsulation layer and a second inorganic encapsulation layer are sequentially stacked.

Here, 50% e.g. of the lights emitted from the emission layer EL of the light emitting display device according to the first embodiment of the present disclosure can be emitted upward through the cathode electrode CAT. The remaining 50% e.g. passes through the anode electrode ANO formed of a transparent conductive material and goes to the reflective layer REF. Light pass through the anode electrode ANO can be reflected by the reflective layer REF and emitted upward through the anode electrode ANO, the emission layer EL and the cathode electrode CAT. When the light is reflected from the reflective layer REF, it can be scattered radially due to the plurality of protrusions formed on the surface of the reflective layer REF. Accordingly, an effect of evenly dispersing luminance over a wide range can be obtained. In addition, since the light is diffused as wide as possible within each pixel P, an effect in which light is emitted with a wide viewing angle can be obtained. Furthermore, since the top surface of the light emitting diode OLE is formed flat, there is no problem of reducing light efficiency.

Referring to FIG. 5, a cross-sectional structure spanning neighboring first and second pixels P1 and P2 will be described. A first light emitting diode OLE1 can be formed in the first pixel P1, and a second light emitting diode OLE2 can be formed in the second pixel P2. The first emission area EA1 can be disposed in the first pixel P1, and the second emission area EA2 can be disposed in the second pixel P2. A first reflective layer REF1 and a first nano-based layer IT1 can be disposed below the first light emitting diode OLE1. Furthermore, a second reflective layer REF2 and a second nano-based layer IT2 can be disposed below the second light emitting diode OLE2.

The first light emitting diode OLE1 includes a first anode electrode ANO1, an emission layer EL and a cathode electrode CAT. The second light emitting diode OLE2 includes a second anode electrode ANO2, the emission layer EL and the cathode electrode CAT. The first and second anode electrodes ANO1 and ANO2 can be patterned and formed on the first pixel P1 and the second pixel P2, respectively. However, the emission layer EL and the cathode electrode CAT can be commonly stacked in the first pixel P1 and the second pixel P2.

A first nano-base layer IT1 and a first reflective layer REF1 can be formed between the first planarization layer PL1 and the second planarization layer PL2 under the first anode electrode ANO1. The first nano-based layer IT1 and the first reflective layer REF1 can have sizes and shapes corresponding to those of the first anode electrode ANO1. The first nano-particles NP can be formed on the surface of the first nano-based layer IT1.

A second nano-based layer IT2 and a second reflective layer REF2 can be formed between the first planarization layer PL1 and the second planarization layer PL2 under the second anode electrode ANO2. The second nano-based layer IT2 and the second reflective layer REF2 can have sizes and shapes corresponding to those of the second anode electrode ANO2. The second nano-particles NP2 can be formed on the surface of the second nano-based layer IT2. The first buffer layer BU1 can be formed as a continuous layer covering both the first pixel P1 and the second pixel P2.

In addition, it is necessary to prevent light generated from the first emission area EA1 (disposed in the first pixel P1) from being reflected by the first reflective layer REF1 and leaking into the second pixel P2 or to prevent light generated from the second emission area EA2 (disposed in the second pixel P2) from being reflected by the second reflective layer REF2 and leaking into the first pixel P1. For this purpose, it is preferable to form the bank BA disposed between the first anode electrode ANO1 and the second anode electrode ANO2 with a black material including one of a black pigment in which carbon black is exclusively used or two or more coloring pigments are mixed, a black dye in which a black dye is exclusively used or two or more different dyes are mixed to produce black, a black resin, graphite powder, gravure ink, black spray and black enamel.

Second Embodiment

Figure 6:
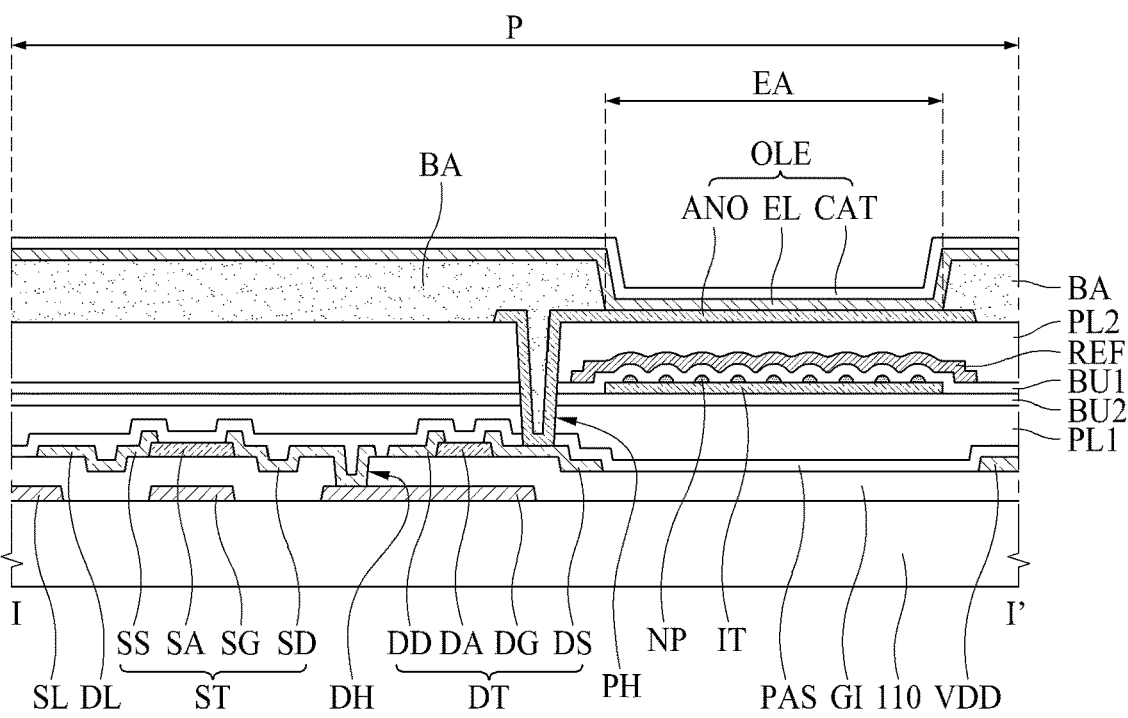
FIG. 6 is a cross-sectional view along to cutting line I-I' in FIG. 3, for illustrating a structure of the light emitting display device according to a second embodiment of the present disclosure.
Figure 7:
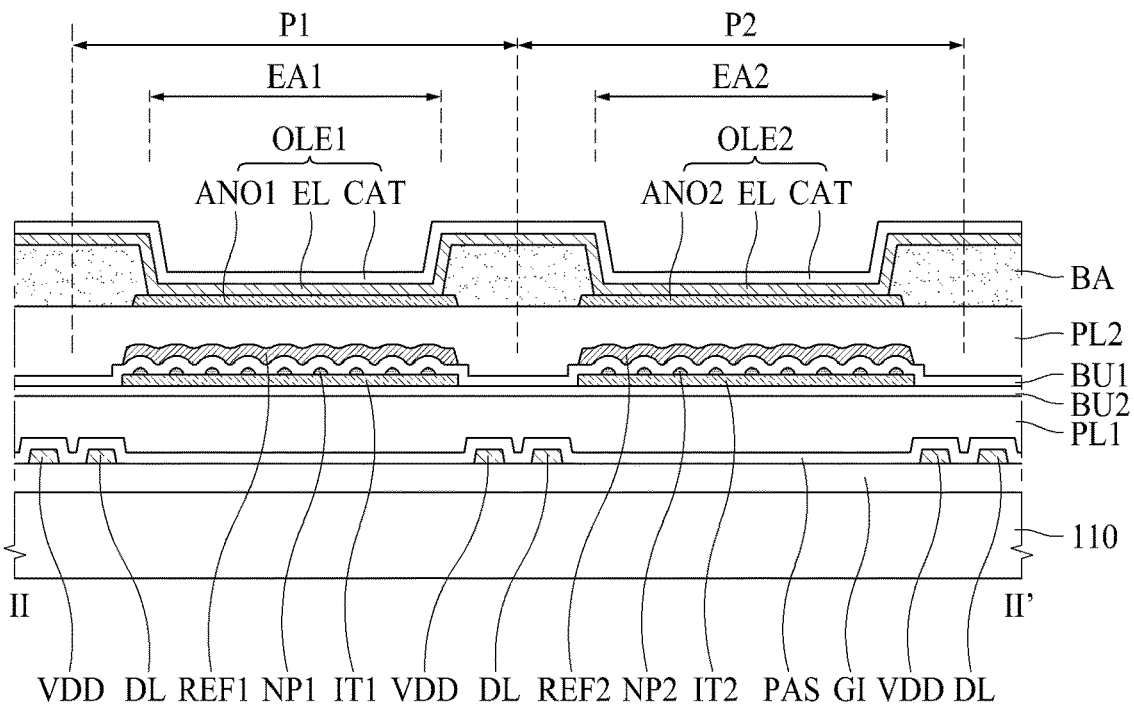
FIG. 7 is a cross-sectional view along to cutting line II-II' in FIG. 3, for illustrating a structure of the light emitting display device according to the second embodiment of the present disclosure.

Hereinafter, referring to FIGS. 6 and 7, a structure of a light emitting display device according to a second embodiment of the present disclosure will be explained. FIG. 6 is a cross-sectional view along to cutting line I-I' in FIG. 3, for illustrating a structure of the light emitting display device according to the second embodiment of the present disclosure. FIG. 7 is a cross-sectional view along to cutting line II-II' in FIG. 3, for illustrating a structure of the light emitting display device according to the second embodiment of the present disclosure.

Referring to FIG. 6, the structure of a light emitting display device according to the second embodiment can be similar with that of the first embodiment. The different feature is that a second buffer layer BU2 is further disposed between the first planarization layer PL1 and the nano-based layer IT. As the elements except the second buffer layer BU2 are the same or substantially the same as those of the first embodiment, reference numerals shown in the drawing but not described below can be referred to and understood from the description of the first embodiment of the present disclosure provided above.

In the second embodiment, the second buffer layer BU2 can be formed of an inorganic material. For example, the second buffer layer BU2 can be formed of a single layer including a silicon nitride material, a silicon oxide material or a silicon oxynitride material. As another example, the second buffer layer BU2 can be formed of a multi-layered film in which a silicon oxide material, a silicon nitride material, and/or a silicon oxynitride material are stacked.

By further including the second buffer layer BU2 having, for example, silicon nitride under the nano-based layer IT, when depositing the nano-based layer IT, it is deposited in a hydrogen particle atmosphere. Therefore, the nano particle NP can be formed even in the process of depositing the nano-based layer IT. Further, when the first buffer layer BU1 is formed on the nano-based layer IT, the nano-particle NP can be formed.

As a result, in the structure according to the second embodiment, a larger amount of nano-particles NP than in the first embodiment is provided. Therefore, the second embodiment can provide a light emitting display device with improved light extraction efficiency.

Third Embodiment

Figure 8:
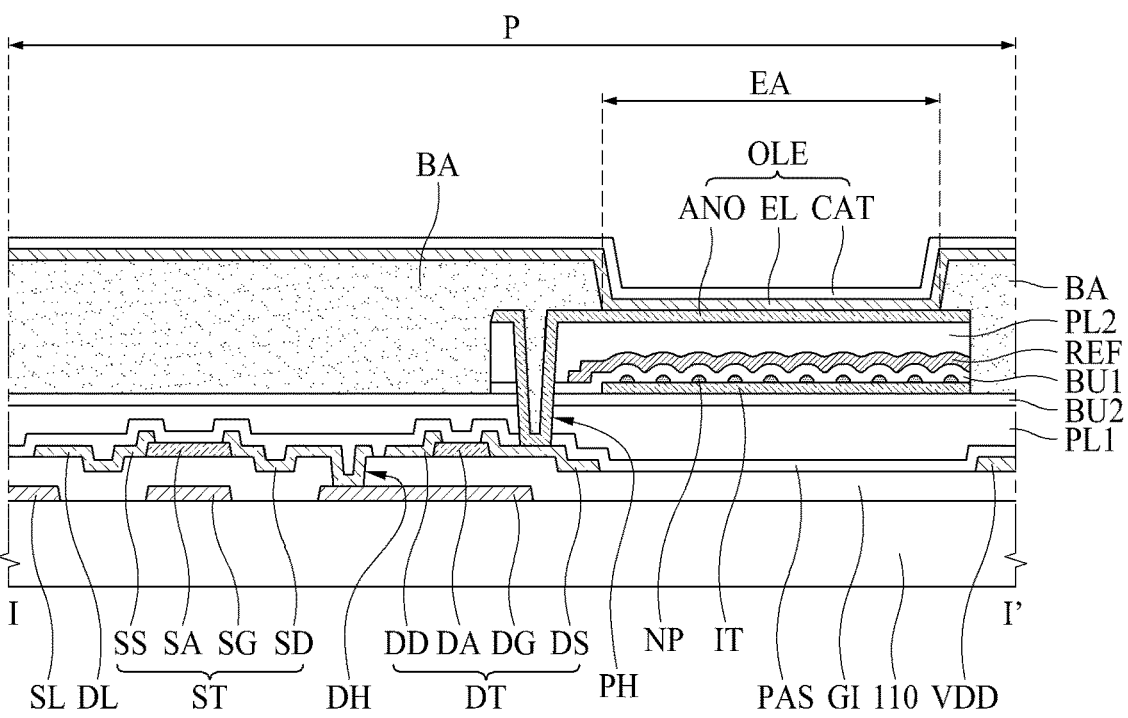
FIG. 8 is a cross-sectional view along to cutting line I-I' in FIG. 3, for illustrating a structure of the light emitting display device according to a third embodiment of the present disclosure.
Figure 9:
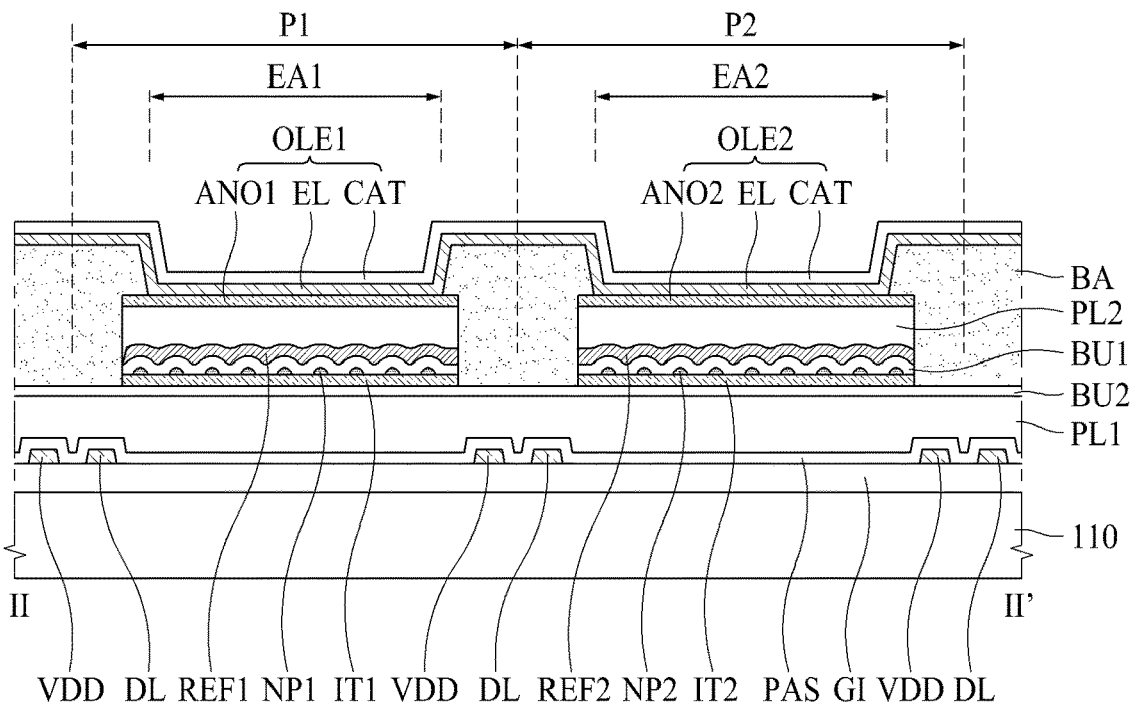
FIG. 9 is a cross-sectional view along to cutting line II-II' in FIG. 3, for illustrating a structure of the light emitting display device according to the third embodiment of the present disclosure.

Hereinafter, referring to FIGS. 8 and 9, a structure of a light emitting display device according to a third embodiment will be explained. FIG. 8 is a cross-sectional view along to cutting line I-I' in FIG. 3, for illustrating a structure of the light emitting display device according the a third embodiment of the present disclosure. FIG. 9 is a cross-sectional view along to cutting line II-II' in FIG. 3, for illustrating a structure of the light emitting display device according to the third embodiment of the present disclosure.

As in the second embodiment shown in FIGS. 6 and 7, a light emitting display device according to the third embodiment can have a first buffer layer BU1 covering the nano-based layer IT and a second buffer layer BU2 stacked under the nano-based layer IT. The different feature from the second embodiment is that a reflection layer REF and the nano-based layer IT are patterned having the same size as the anode electrode ANO. Elements that are the same as or similar to the elements in the previous embodiments may not be mentioned or may be discussed briefly.

Referring to FIGS. 8 and 9, for example, the second buffer layer BU2 can be stacked over the entire display area AA. A nano-based layer IT can be stacked on the second buffer layer BU2 to cover the entire display area AA, and the nano-based layer IT can be patterned to exclude a location where the pixel contact hole PH is to be formed. A first buffer layer BU1 can be stacked over the entire display area AA on the nano-based layer IT. A reflective layer REF can be stacked on the first buffer layer BU1 to cover the entire display area AA, and the reflective layer REF can be patterned to exclude a location where the pixel contact hole PH is to be formed. A second planarization layer PL2 can be deposited on the reflective layer REF to cover the entire display area AA.

By forming the pixel contact hole PH penetrating the second planarization layer PL2, the first buffer layer BU1, the second buffer layer BU2, the first planarization layer PL1 and the passivation layer PAS, a portion of the source electrode DS of the driving thin film transistor DT can be exposed. A transparent conductive material is applied over the entire display area AA on the second planarization layer PL2. The transparent conductive material is connected to the source electrode DS of the driving thin film transistor DT through the pixel contact hole PH.

After that, by using a mask for forming the anode electrode ANO, the transparent conductive material layer, the second planarization layer PL2, the reflective layer REF, the first buffer layer BU1 and the nano-based layer IT are patterned at the same time. As a result, the anode electrode ANO can be formed. In addition, the reflective layer REF and the nano-based layer IT are formed to have the same size as the anode electrode ANO except the location where the pixel contact hole PH is formed under the anode electrode ANO. Further, the second planarization layer PL2 and the first buffer layer BU1 can be patterned to have the same size as the anode electrode ANO except the location where the pixel contact hole PH is formed. Here, it is preferable not to pattern the second buffer layer BU2. This is to protect the second buffer layer BU2 made of an inorganic material so that the first planarization layer PL1 is not exposed.

A bank BA covering the edge portions of the anode electrode ANO and exposing the central area is formed. As a result, the bank BA has a structure in contact with the etched side surfaces of the second planarization layer PL2, the reflective layer REF, the first buffer layer BU1 and the nano-based layer IT.

The light emitting display device according to the third embodiment includes the second planarization layer PL2, the reflective layer REF and the nano-based layer IT which are patterned identically to the anode electrode ANO formed for each pixel P. As the second planarization layer PL2, the reflective layer REF, the first buffer layer BU1 and the nano-based layer IT are applied to the entire display area AA, a waveguide can be formed in which light generated from one pixel P is guided to an adjacent pixel P along the anode electrode ANO, the second planarization layer PL2, the reflective layer REF, the first buffer layer BU1 and the nano-based layer IT. In this case, color mixing can occur between neighboring pixels P.

In the third embodiment, since the second planarization layer PL2, the reflective layer REF, the first buffer layer BU1 and the nano-based layer IT are patterned to be separated for each pixel P, the color mixing between neighboring pixels can be minimized. In addition, when the bank BA is formed of a black resin material, the color mixing between neighboring pixels can be completely prevented.

As a modified example of the third embodiment, when patterning the anode electrode ANO, the transparent conductive material layer, the second planarization layer PL2 and the reflective layer REF are patterned together, but the first buffer layer BU1 and the nano-based layer IT may not be patterned. Since the main layers causing the color mixing problem are the second planarization layer PL2 and the reflective layer REF, by patterning just these layers, the waveguide path causing the color mixing can be removed.

Fourth Embodiment

Figure 10:
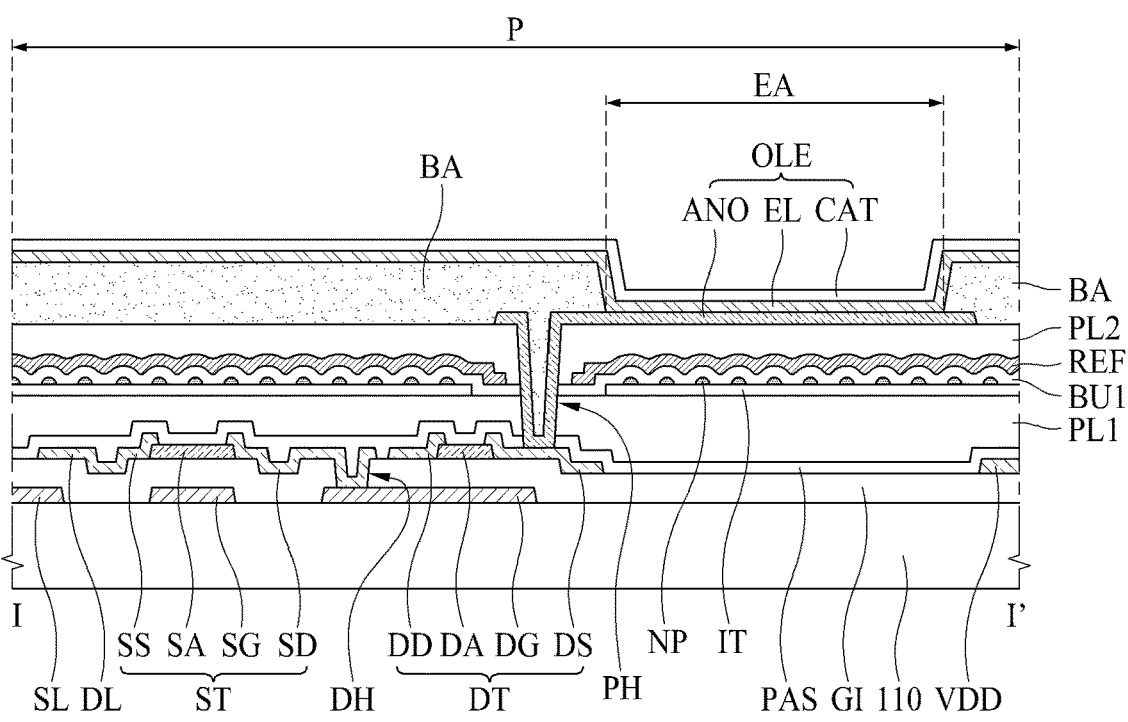
FIG. 10 is a cross-sectional view along to cutting line I-I' in FIG. 3, for illustrating a structure of the light emitting display device according to a fourth embodiment of the present disclosure.
Figure 11:
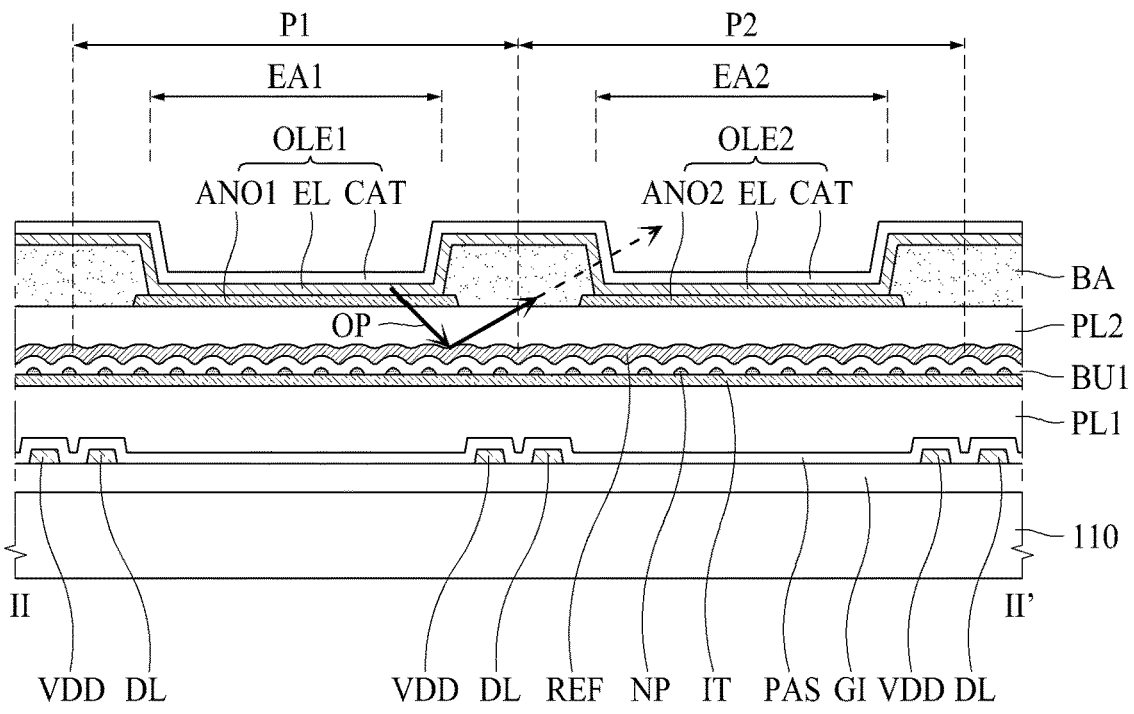
FIG. 11 is a cross sectional view along to cutting line II-II' in FIG. 3, for illustrating a structure of the light emitting display device according to the fourth embodiment of the present disclosure.

Hereinafter, referring to FIGS. 10 and 11, a structure of a light emitting display device according to a fourth embodiment will be explained. FIG. 10 is a cross-sectional view along to cutting line I-I' in FIG. 3, for illustrating a structure of the light emitting display device according to the fourth embodiment of the present disclosure. FIG. 11 is a cross sectional view along to cutting line II-II' in FIG. 3, for illustrating a structure of the light emitting display device according to the fourth embodiment of the present disclosure.

A light emitting display device according to the fourth embodiment has a very similar structure as that of the first embodiment. A main feature of the fourth embodiment is that the nano-based layer IT and the reflective layer REF are not corresponding to the emission area of each pixel P, but have a shape and size corresponding to the entire display area AA.

Referring to FIGS. 10 and 11, for example, the nano-based layer IT can have a shape corresponding to the entire shape of the display area AA having the pixels P except for the pixel contact hole PH.

The first buffer layer BU1 is deposited on the nano-based layer IT. The first buffer layer BU1 stacked on the upper surface of the nano-based layer IT can be disposed over the entire display area AA to cover all pixels P disposed on the substrate 110. The first buffer layer BU1 can include a nitride material, oxide material or oxynitride material.

The reflective layer REF is deposited on the first buffer layer BU1. The reflective layer REF can be made of any one material or an alloy of two or more materials selected from silver (Ag), aluminum (Al), molybdenum (Mo), gold (Au), magnesium (Mg), calcium (Ca), or barium (Ba). The reflective layer REF can be disposed over the entire display area AA to cover all pixels P on the substrate 110.

In the case that the reflective layer REF and the nano-based layer IT are deposited over the entire display area AA as explained in the fourth embodiment, the color mixing between two neighboring pixels P can occur. For example, referring to a light path OP in FIG. 11, the reflective layer REF is disposed under the bank BA disposed between a first pixel P1 and a second pixel P2. Some of the light emitted from the first light emitting diode OLE1 of the first pixel P1 can be reflected by the reflective layer REF, and then can go to the second pixel P2.

To prevent this issue, it is preferred that the bank BA is made of a black resin material. In this case, most amount of the light which is generated from the neighboring pixel and reflected by the reflective layer REF can be absorbed by the bank BA, so the color mixing problem can be prevented. The solid line in the light path shown in the FIG. 11 refers to a path of the light, and the dotted line refers to the blocked light by the black resin material of the bank BA.

Fifth Embodiment

Figure 12:
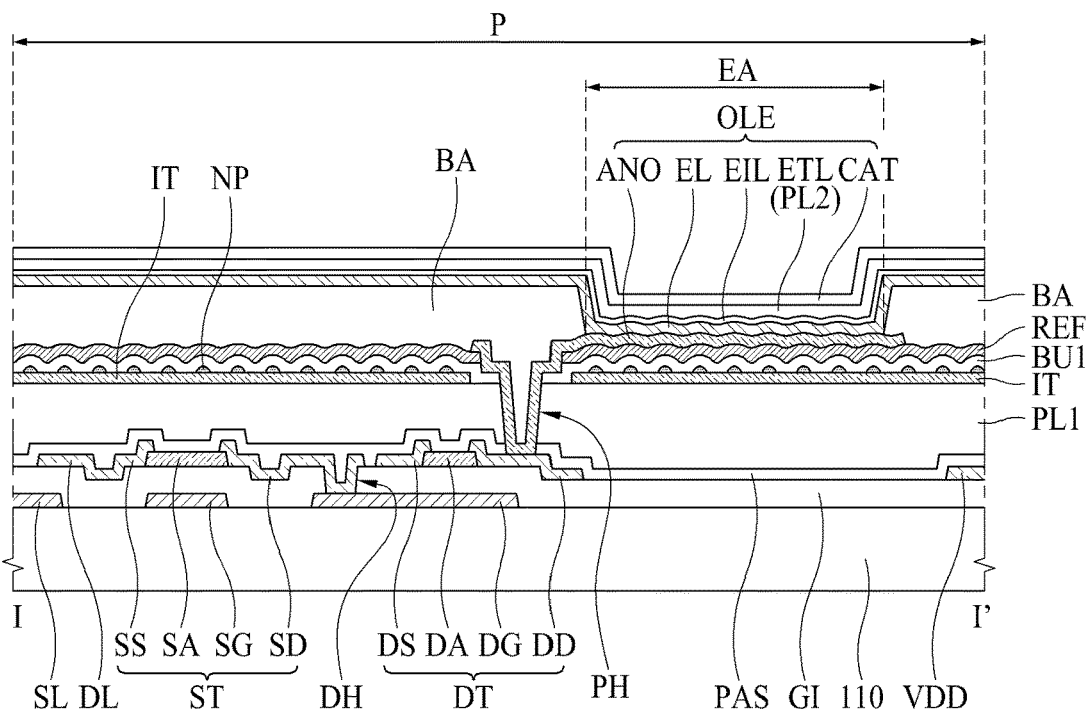
FIG. 12 is a cross sectional view along to cutting line I-I' in FIG. 3, for illustrating a structure of the light emitting display device according to a fifth embodiment of the present disclosure.
Figure 13:
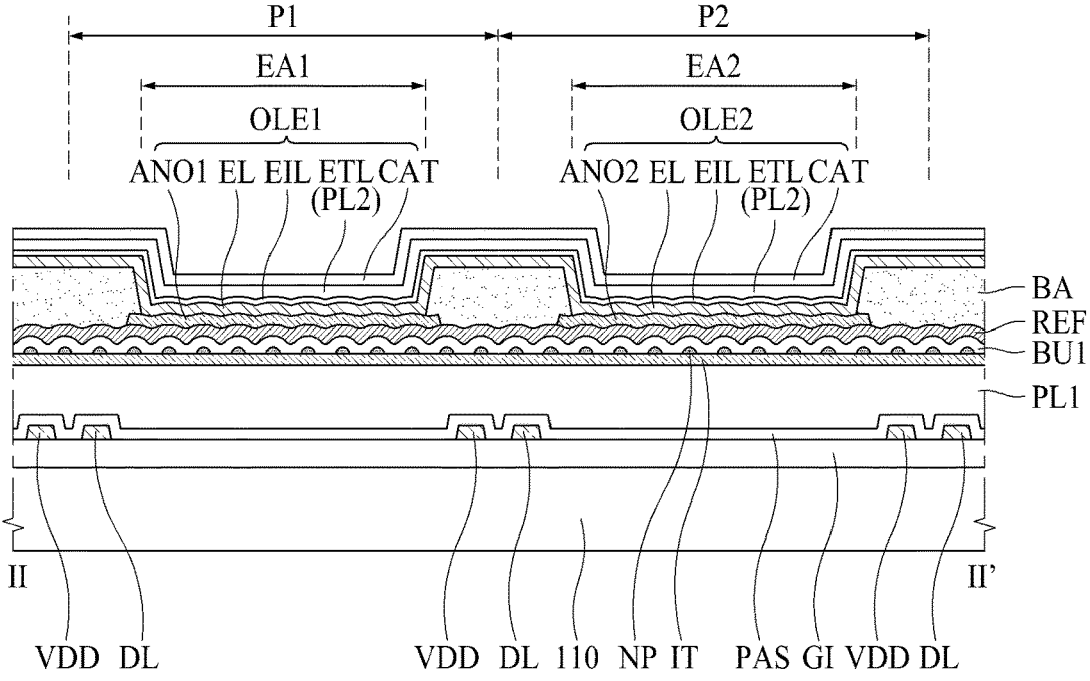
FIG. 13 is a cross sectional view along to cutting line II-II' in FIG. 3, for illustrating a structure of the light emitting display device according to the fifth embodiment of the present disclosure.

Hereinafter, referring to FIGS. 12 and 13, a structure of a light emitting display device according to a fifth embodiment will be explained. FIG. 12 is a cross sectional view along to cutting line I-I' in FIG. 3, for illustrating a structure of the light emitting display device according to the fifth embodiment of the present disclosure. FIG. 13 is a cross sectional view along to cutting line II-II' in FIG. 3, for illustrating a structure of the light emitting display device according to the fifth embodiment of the present disclosure.

A light emitting display device according to the fifth embodiment of the present disclosure has a very similar structure of plan view with that of the first embodiment. Therefore, for a plan view, refer to FIG. 3, which is the same as that of the first embodiment. For the main features of the fifth embodiment, refer to FIGS. 12 and 13 illustrating the cross-sectional views.

Referring to FIG. 12, thin film transistors ST and DT are formed on the substrate 110. A passivation layer PAS is deposited on the substrate 110 as covering the thin film transistors ST and DT. It is preferable that the passivation layer PAS is made of an inorganic material including silicon oxide, silicon nitride, silicon oxynitride, etc. A first planarization layer PL1 is deposited on the passivation layer PAS. The top surface of the substrate 110 having the thin film transistors ST and DT can have uneven condition. To make the top surface have even condition, the first planarization layer PL1 can be deposited on the top surface. In order to uniformity compensate for the height differences, the second planarization layer PL2 can be made of an organic material such as an acrylic resin, an epoxy resin, a phenolic resin, photo acryl, benzocyclobutene (BCB), polyimide (PI), or polyamide (PA), but is not limited thereto.

A nano-based layer IT is deposited on the top surface of the first planarization layer PL. A plurality of nano-particles NP can be formed at the top surface of the nano-based layer IT. The nano-based layer IT can be formed of a transparent conductive material such as indium tin oxide (ITO), indium zinc oxide (IZO), tin oxide (TO), indium tin zinc oxide (ITZO), or the like. The nano-particles NP can be formed for example of an indium material precipitated from an indium tin oxide material, indium zinc oxide, indium tin zinc oxide, or the like. The nano-particles NP can be scattered on the surface of the nano-based layer IT in an irregular arrangement.

The nano-based layer IT can have a shape corresponding to the whole (entire) of the display area AA having the pixels P except the pixel contact hole PH. For example, the nano-based layer IT can be deposited over of the entire display area AA. However, it can have a shape in which only the portion where the pixel contact hole PH is to be formed is removed.

A first buffer layer BU1 is deposited on the nano-based layer IT. The first buffer layer BU1 can include nitride material oxide material, oxynitride material, etc. For example, the first buffer layer BU1 can be made of a single layer of silicon nitride (SiNx), silicon oxide (SiOx), or silicon oxynitride (SiONx). For another example, the first buffer layer BU1 can have a structure in which a thin film made of silicon nitride (SiNx), silicon oxide (SiOx), or silicon oxynitride (SiONx) and a thin film made of silicon oxide (SiOx), silicon nitride (SiNx), or silicon oxynitride (SiONx) are stacked. The first buffer layer BU1 stacked on the top surface of the nano-based layer IT can be deposited over the entirety of the display area AA as covering the whole (entire) pixels P disposed on the substrate 110. Since the first buffer layer BU1 is an inorganic material, the protruding shape of the nano-particle NP can be reflected on the surface as it is, so that the first buffer layer BU1 is not flat and has an upper surface in which concave-convex portions are reflected.

An anode electrode ANO is formed over the first buffer layer BU1. Since the top surface of the first buffer layer BU1 has uneven condition, the anode electrode ANO can have a cross-sectional shape in which concave portions and convex portions are continuously disposed on the surface.

Since the display device according to the present disclosure relates to the top emission type, the anode electrode ANO can be made of a metal material having excellent light reflectance. For example, the anode electrode ANO can be made of any one material or an alloy of two or more materials selected from silver (Ag), aluminum (Al), molybdenum (Mo), gold (Au), magnesium (Mg), calcium (Ca), barium (Ba) or the like or any combination thereof. For another example, as shown in FIGS. 12 and 13, a reflective layer REF having excellent light reflectance is firstly formed and the anode electrode ANO made of a transparent conductive material is deposited on the reflective layer REF. For example, the reflective layer REF disposed at the lower layer is made of any one material selected from silver (Ag), aluminum (Al), molybdenum (Mo), gold (Au), magnesium (Mg), calcium (Ca), barium (Ba) or the like having excellent light reflectance. The anode electrode ANO is made of an oxide conductive material such as tin oxide (TO), indium-zinc-oxide (IZO) or indium-tin-oxide (ITO), indium tin zinc oxide (ITZO), or the like.

The anode electrode ANO can be connected to the source electrode DS of the driving thin film transistor DT via the pixel contact hole PH exposing a portion of the source electrode DS of the driving thin film transistor DT by penetrating the passivation layer PAS, the first planarization layer PL1, the first buffer layer BU1 and the reflective layer RE.

A bank BA is formed on the anode electrode ANO. The bank BA can cover circumference edges of the anode electrode ANO and exposing most central portion of the anode electrode ANO to define the emission area EA. To ensure uniform luminous efficiency in the emission area EA, the bank BA can be formed to cover the pixel contact hole PH.

The emission layer EL can be stacked on the anode electrode ANO and the bank BA. Since the anode electrode ANO has uneven surface condition, the emission layer EL can have uneven surface condition in which concave-convex portions are repeated. The emission layer EL can be deposited over the entire display area AA of the substrate 110 as covering the anode electrode ANO and the bank BA. As for the organic light emitting display device, the emission layer EL can include an organic material. As for the inorganic light emitting display device, the emission layer EL can include an inorganic material.

Since the emission layer EL has a cross-sectional shape in which a plurality of concave-convex portions are repeated, the rate at which light generated in the emission layer EL is confined inside the emission layer EL can be minimized. For example, the light extracting efficiency can be maximized. However, when the cathode electrode CAT can be directly stacked on the emission layer EL, the cathode electrode CAT can also have a cross-sectional profile in which a plurality of concave-convex portions are repeated. As such, when the top surface of the light emitting diode OLE has uneven condition, an adverse effect of lowering the light extracting efficiency can occur.

To prevent this issue, an organic electron transport layer ETL is stacked on the emission layer EL. The organic electron transport layer ETL can have specific structure according to the present disclosure. The organic electron transport layer ETL is a functional layer for transporting the electrons from the cathode electrode CAT to the emission layer EL. The organic electron transport layer ETL is preferably formed of an organic material and stacked on the uneven surface of the emission layer EL to provide a flat (or even) surface.

For an example, in order to ensure high flatness, the organic electron transport layer ETL can be formed thick. However, when the organic electron transport layer ETL is stacked too thickly, the electron transport function can be degraded. Therefore, in order to ensure the electron transport function while maintaining the flatness of the top surface, it is preferable to form the organic electron transport layer ETL thickly and then make the organic electron transport layer ETL thin using an etching process.

In this etching process, the convex portion of the emission layer EL can be damaged. To prevent this issue, it is preferable to further deposit an inorganic electron injection layer EIL between the emission layer EL and the organic electron transport layer ETL. The inorganic electron injection layer EIL is a functional layer that injects electrons supplied form the organic electron transport layer ETL into the emission layer EL. In particular, since the inorganic electron injection layer EIL is to prevent damage to the emission layer EL in the process of etching the thickness of the organic electron transport layer ETL thin, it is preferable to form an inorganic material.

As a result, the organic electron transport layer ETL formed on the emission layer EL has a flat top surface. The cathode electrode CAT is deposited on the organic electron transport layer ETL. The cathode electrode CAT can be stacked to form surface contact with the organic electron transport layer ETL. Since the top surface of the organic electron transport layer ETL is flat, the cathode electrode CAT can also have a flat top surface. In the fifth embodiment, the organic electron transport layer ETL plays a role to flatten the top surface of the light emitting diode OLE like the second planarization layer PL2 of the first embodiment.

Here, 50% e.g. of the lights emitted from the emission layer EL of the light emitting display device according to the fifth embodiment of the present disclosure can be emitted upward through the cathode electrode CAT. The remaining 50% e.g. can be reflected by the anode electrode ANO having the reflective metal material and then can be go out through the emission layer EL, the inorganic electron injection layer EIL, the organic electron transport layer ETL and the cathode electrode CAT. When being reflected by the anode electrode ANO, the lights can be scattered in wide radial directions, due to the concave-convex portions formed at the surface of the anode electrode ANO. Accordingly, an effect of evenly dispersing luminance over a wide range can be obtained. Furthermore, since the emission layer EL does not have flattened cross-sectional profile but waved cross-sectional profile in which a plurality of concave-convex portions are repeated, the light efficiency can be improved by minimizing the amount of lights trapped inside the emission layer EL. In addition, since the top surface of the light emitting diode OLE maintains the flattened condition, there is no problem of reduced light efficiency.

In the fifth embodiment, it is explained about a structure in which the nano-based layer IT is applied over the entire display area AA. However, the nano-based layer IT can be patterned to have the shape and size corresponding to the emission area EA inside the each pixel P, as explained in the first embodiment. In addition, in the fifth embodiment, it has been described that only the first buffer layer BU1 is provided on the nano-based layer IT. However, when it is necessary, a second buffer layer can be further provided under the nano-based layer IT. The fifth embodiment can be implemented in various ways by combining with any one of the first to fourth embodiments of the present disclosure.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment can be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:
a first planarization layer on a substrate;
a nano-based layer having a plurality of nano particles on the first planarization layer;
a first buffer layer on the nano-based layer;
a reflective layer on the first buffer layer;
a second planarization layer on the reflective layer; and
a light emitting element on the second planarization layer.

2. The light emitting display device according to claim 1, wherein the plurality of nano particles has a protrusion shape disposed on a top surface of the nano-based layer.

3. The light emitting display device according to claim 1, wherein the first buffer layer includes a plurality of protrusions corresponding to the plurality of nano particles, and
wherein the reflective layer includes a plurality of reflective protrusions corresponding to the plurality of protrusions of the first buffer layer.

4. The light emitting display device according to claim 3, wherein the second planarization layer provides a flat top surface on the plurality of reflective protrusions, and
wherein the light emitting element contacts the flat top surface of the second planarization layer.

5. The light emitting display device according to claim 1, further comprising:
a driving layer including thin film transistors disposed between the substrate and the first planarization layer, wherein the first planarization layer has a thickness in range of about 2 μm to 3 μm.

6. The light emitting display device according to claim 1, wherein the second planarization layer has a thickness in range of about 20 nm to 500 nm and a refractive index in range of about 1.8 to 2.0.

7. The light emitting display device according to claim 1, further comprising:
a second buffer layer between the first planarization layer and the nano-based layer.

8. The light emitting display device according to claim 1, wherein the light emitting element includes:
an anode electrode on the second planarization layer;
an emission layer on the anode electrode; and
a cathode electrode on the emission layer.

9. The light emitting display device according to claim 8, wherein each of the anode electrode, the emission layer and the cathode electrode provides a flat top surface at an area where the plurality of nano particles is disposed.

10. The light emitting display device according to claim 8, wherein the nano-based layer and the reflective layer have a shape and a size corresponding to the anode electrode.

11. The light emitting display device according to claim 8, further comprising:
a bank covering circumference areas of the anode electrode to define an emission area.

12. The light emitting display device according to claim 11, wherein the bank includes a black resin material.

13. The light emitting display device according to claim 1, wherein the nano-based layer includes indium-tin-oxide.

14. The light emitting display device according to claim 1, wherein the reflective layer includes at least one of silver (Ag), aluminum (Al), molybdenum (Mo), gold (Au), magnesium (Mg), calcium (Ca), and barium (Ba).

15. A light emitting display device comprising:
a planarization layer on a substrate;
a nano-based layer including a plurality of nano particles disposed on the planarization layer;
a first buffer layer on the nano-based layer;
an anode electrode including a reflective material on the first buffer layer;
an emission layer on the anode electrode;
an inorganic layer on the emission layer;
an organic layer on the inorganic layer; and
a cathode electrode on the organic layer.

16. The light emitting display device according to claim 15, wherein the inorganic layer includes an electron injection material, and
wherein the organic layer include an electron transport material.

17. The light emitting display device according to claim 15, wherein the plurality of nano patterns includes a plurality of first protrusions disposed on a top surface of the nano-based layer,
wherein the first buffer layer includes a plurality of second protrusions corresponding to the plurality of first protrusions, wherein the anode electrode includes a plurality of reflective protrusions corresponding to the plurality of second protrusions, and wherein the emission layer and the inorganic layer have a cross-sectional profile corresponding to the plurality of reflective protrusions.

18. The light emitting display device according to claim 17, wherein the organic layer provides a flat top surface on the inorganic layer, and wherein the cathode electrode has a flat surface on the flat top surface of the organic layer.

19. A light emitting display device comprising:

a nano-based layer including a plurality of nano particles on a substrate;

a reflective layer including a plurality of protrusions corresponding to the plurality of nano particles on the plurality of nano patterns;

an anode electrode on the reflective layer;

an emission layer on the anode electrode; and a cathode electrode on the emission layer, wherein the anode electrode has a cross-sectional profile that is same as or different from the reflective layer, and wherein the cathode electrode has a cross-sectional profile that is different from the reflective layer.

20. A light emitting display device comprising:

a nano-based layer including a plurality of nano particles on a substrate;

a reflective layer including a plurality of protrusions corresponding to the plurality of nano particles;

an anode electrode on the reflective layer;

an emission layer on the anode electrode;

a cathode electrode on the emission layer; and a planarization layer between the reflective layer and anode electrode, or between the emission layer and the cathode electrode.

* * * * *